United States Patent [19]
Lyons et al.

[11] Patent Number: 5,293,035
[45] Date of Patent: Mar. 8, 1994

[54] CHARGE-COUPLED DEVICES

[76] Inventors: James W. Lyons, 1 Bridge Road, South Cave, Brough, Yorkshire; John D. Bannister, 202 New Village Road, Cottingham HU16 4NL, Yorkshire, both of England

[21] Appl. No.: 512,315

[22] Filed: Oct. 3, 1974

[51] Int. Cl.$^5$ .................... H01L 31/00; H01L 31/0352
[52] U.S. Cl. .................. 250/208.1; 250/332; 250/370.08; 257/440; 257/443
[58] Field of Search ............ 250/339, 211 J, 370, 250/578, 370.08, 332, 208.1; 357/24, 30; 257/443, 440

[56] References Cited

U.S. PATENT DOCUMENTS

| | | | |
|---|---|---|---|
| 3,777,061 | 12/1973 | Takemura | 357/24 |
| 3,806,729 | 4/1974 | Caywood | 250/339 |
| 3,852,799 | 12/1974 | Walden | 357/24 |
| 3,873,836 | 3/1975 | Greene | 250/370 |

*Primary Examiner*—Stephen C. Buczinski
*Attorney, Agent, or Firm*—Howard L. Rose

[57] ABSTRACT

A charge-coupled detector array consists of a semiconductor substrate layer and an insulating surface layer which is castellated to give two different surface levels, and each of a row of electrodes applied to the insulating layer has a first portion at the higher surface level and a second portion at the lower level.

Alternate electrodes in the row are connected to one electrical lead, the intervening electrodes are connected to a second lead, and in the case of electrodes connected to one lead only all the portions at the lower surface level have regions of passivating material applied opposite to them, at the other side of the substrate. Masking metal regions are provided on the substrate opposite to the electrode portions at the higher surface level in respect of all the electrodes connected to both leads.

5 Claims, 3 Drawing Sheets

CHARGE-COUPLED DEVICES

This invention relates to charge-coupled devices. More particularly, though not exclusively, it is concerned with their application to an airborne multi-mode sensor.

The advent of semi-conductor technology has considerably advanced our ability to detect radiation at infra-red wavelengths. The mechanism of detection relates on the phenomena of interaction of incident photon energy from the viewed scene with the electronic structure of a semi-conductor material. This process releases electrons which move freely under the influence of an external field. Measurements of the resulting current give a direct indication of the magnitude of the incident radiation.

Until recently, detectors have been produced as single elements suitable for location at the focal point of an optical system and generally having sizes of around 1 $mm^2$. Fabrication methods have however been developed for producing integrated circuits on silicon chips and essentially the same techniques can be adopted for producing multi-element detectors in line arrays or matrix form. There are severe difficulties in producing arrays with large numbers of elements and the associated circuitry for addressing each elemental detector, and reading out the received signal can be complex.

The comparatively recent development of charge-coupled devices simplifies considerably the technology involved and these devices can be operated in a number of ways simply by adopting differing signal processing techniques.

If a two dimensional detector can be produced having sufficient resolution elements, then an image of the viewed scene can be formed. For acceptable, quality images the individual detector elements making up the array must be capable of providing adequate contrast in response to scene variation. In other words, the quantum efficiency of conversion of incident photons into conduction electrons must be high.

Charge-coupled technology stores the image as packets of charge formed in potential wells in a semi-conductor substrate. The detector is backed by metallic conducting contacts separated from the substrate by a thin ($\sim 20$ Å) insulating layer.

The image is read out from the detector by applying a sequential voltage variation to the contacts which shifts the stored charge packets laterally through the substrate into a buffer store from which the image can be obtained as a video signal, line by line. This technique eliminates the need for using arrays of back biased diodes and scanning the image by means of electron beams.

The output of the detector therefore consists of a stream of pulses of varying amplitude, the total number per picture corresponding to the number of detector resolution elements. Since a single serial output gate is used, the train of pulses can be processes in a number of ways. For example, successive pulses can be combined, some pulses can be gated out, storing and shifting of the pulses is possible and so forth. This ability enables us to use the detector for operations other than simple imaging thereby enhancing significantly the scope of the unit.

Thus, by using a two-dimensional matrix detector array containing a large number of resolution elements employing charge-coupled technology it is possible to evolve a unit having multi-mode capability, the roles of search, track, image and range measurement being achieved with a single unit.

It is desired to operate the matrix detector at both b 1 micron and 3–5 microns. Present charge-coupled technology uses silicon which is responsive to wavelengths up to about 1 micron. Thus it is required to extend the C.C.D. response either by modifying the silicon response or by using a material for a C.C.D. such as InSb which is responsive at 1 micron and 3–5 microns. The latter method introduces problems of finding a suitable material to use for the insulating layer.

It is therefore an object of the present invention to enhance still further the versatility of the charge-coupled detector.

According to the invention, a charge-coupled detector, comprising at least two series of electrodes applied to an insulating surface layer borne by a semi-conductor substrate, is characterised in that, at the other surface of the substrate which receives the incident radiation to be detected, areas of that other surface opposite to electrodes of one series are treated with additional material to form a heterojunction in order to change the response wave-band of those particular areas. Biasing of the junction may be necessary. Also, it is possible to use heavily doped materials to provide a narrow junction when tunnelling effects occur.

Thus the device may be so constituted that imaging can be carried out in two separate wavebands. This can give high quality pictures of the viewed scene at night in the far visual or mid infra-red bands, whilst in a day role the arrangement of detector processing enables dual waveband cancellation to be implemented for background or incident radiation rejection.

The invention may be more clearly understood from the following description, given with reference to the accompanying drawings in which.

Figure 1:
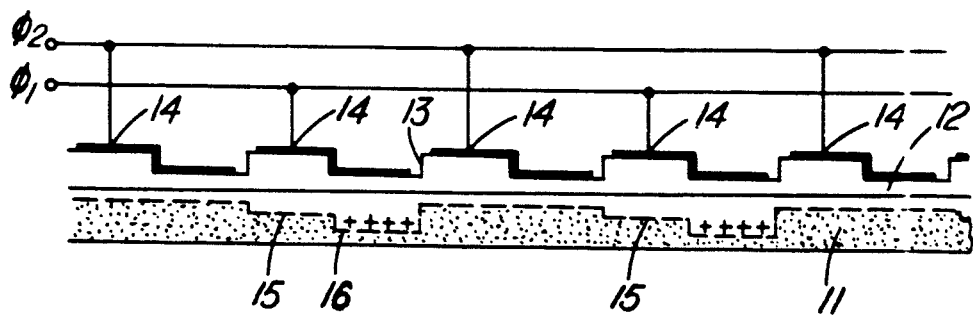
FIG. 1 shows a known arrangement of charge-coupled device.

Referring to FIG. 1, this shows a known arrangement of a charge-coupled device. It comprises a substrate of n-type silicon 11 to which is added an insulating oxide layer 12. This layer is etched to form a castellated surface structure 13 and a stepped metal electrode 14 is deposited on the ridge and valley of each castellation by an evaporation technique. Alternate ones of these electrodes are connected in common to one lead $\phi_1$ and the intervening electrodes are connected to a second lead $\phi_2$. When one lead is negatively biased a stepped potential well 15, 16 matching the electrode configuration is formed in the substrate 11 at the region of each electrode connected thereto, the depth of well being dependent on the applied voltage.

Incident photons on the underside of the substrate 11 generate minority carriers in the silicon which diffuse into adjacent potential wells 15, 16 and are stored. A subsequent application of voltage to the other lead forms further potential wells in the regions of the intervening electrodes which, if deep enough, cause the stored charges to diffuse laterally to these further wells.

A simultaneous reduction in voltage on the first lead removes the first series of wells thereby completing a cycle in the transfer process. Subsequent voltage cycling causes further similar lateral charge transference until the output gate is reached, the stored charges being read out as a video signal. The device therefore performs rather like a shift register, except that the pulses are of variable amplitude each being an analogue of the amount of light that fell on the region where it was originally created.

Figure 2:
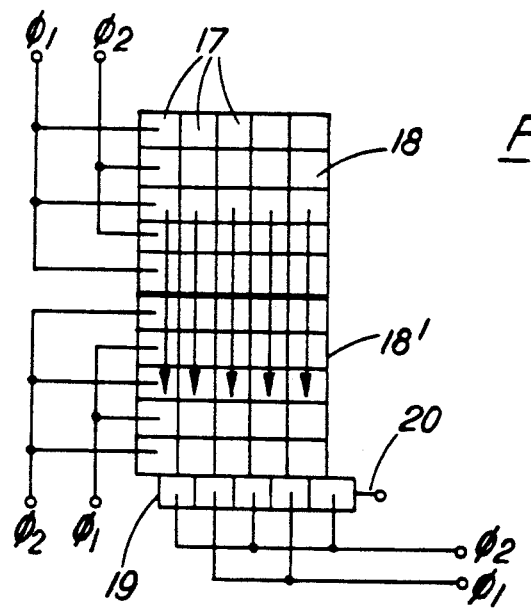
FIG. 2 shows one arrangement of a matrix of detectors.

FIG. 2 shows that by connecting a series of such charge-coupled detector/shift registers 17 in a contiguous side-by-side manner a detector matrix 18 can be built up. The array output is fed into a further shift register 19 of similar construction, disposed orthogonally across the ends of the side-by-side registers, and the stored image read out as at 20 line by line. Intervening buffer storage 18' is usually required to ensure correct framing for optical imaging.

Figure 3:
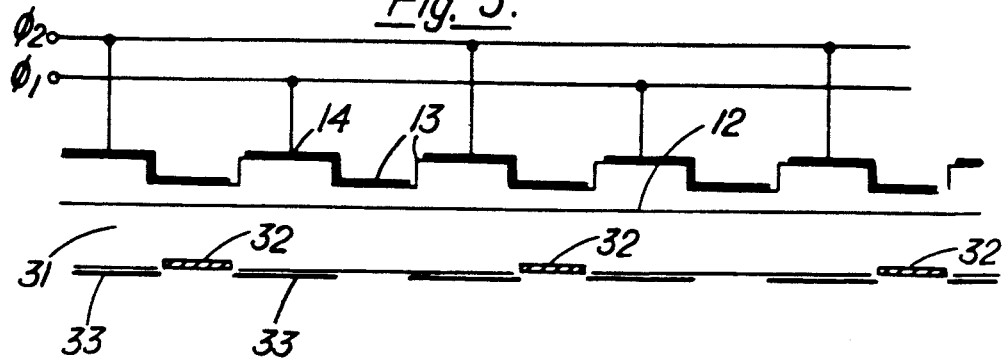
FIG. 3 is a charge-coupled device according to the present invention.

A charge-coupled device according to the present invention is shown in FIG. 3. Since manufacturing techniques using silicon are well developed it is desirable to maintain its use but it is possible to change the waveband response characteristics by adding additional layers of other materials to the illuminated face of the detector. Therefore, for detection of airborne targets for example, the operating waveband should be around 4.2 microns at the centre of the jet plume emission spectrum. This can be achieved by the use of a passivating layer of indium antimonide, InSb.

Referring to FIG. 3, the underside of the silicon substrate 31 has diffused areas 32 of indium antimonide opposite the deeper stepped portions of alternate resolution elements connected to the lead $\phi_2$. Metallic masking 33 is added opposite the shallower stepped portions of both series of electrodes to isolate the windows, both InSb treated and untreated, which are open to incident radiation. The structure is otherwise the same as in FIG. 1.

It will be seen that if potential wells are formed under the $\phi_1$ electrodes the untreated silicon substrate windows are open to the incident radiation and hence the device is sensitive to radiation up to 1 micron, i.e. the normal silicon response curve. The adjacent InSb coated windows 32 are not activated since no potential wells are formed there. After exposure to the incident radiation, the charge stored in the potential wells can be shifted along the array and the image subsequently read out. If, alternatively, potential wells are formed behind the InSb windows, i.e. by interchanging the voltages on the $\phi_1$, $\phi_2$ electrodes, then the device becomes responsive to radiation in the 4 micron band. Minority carriers are formed in the InSb which drift into the potential wells formed in the silicon substrate. Again the stored image can be read out. Therefore, with this form of construction the device can be made to operate at will, simply by appropriate voltage supply commutation, in either on of two wavebands.

If desired, either a near infra-red or mid-band infra-red image can be displayed to the observer. Alternatively, since the silicon detector is responsive only to ambient radiation and not the jet target signal and the InSb detector is responsive to both, it is possible by differencing successive images in the two wavebands to provide dual channel cancellation thereby enhancing the signal-to-background ratio in either imaging or search modes of operation. It is necessary only to delay the image from one scan by a frame interval and compare the signal voltages one resolution element at a time in differencing circuitry. This is analogous to MTI radar technique.

To practise this form of dual waveband operation it is necessary to use InSb deposition only on the imaging section of the detector matrix. Detector cooling is desirable in order to reduce background radiation to a minimum and enhance the detector dynamic range.

Figure 4:
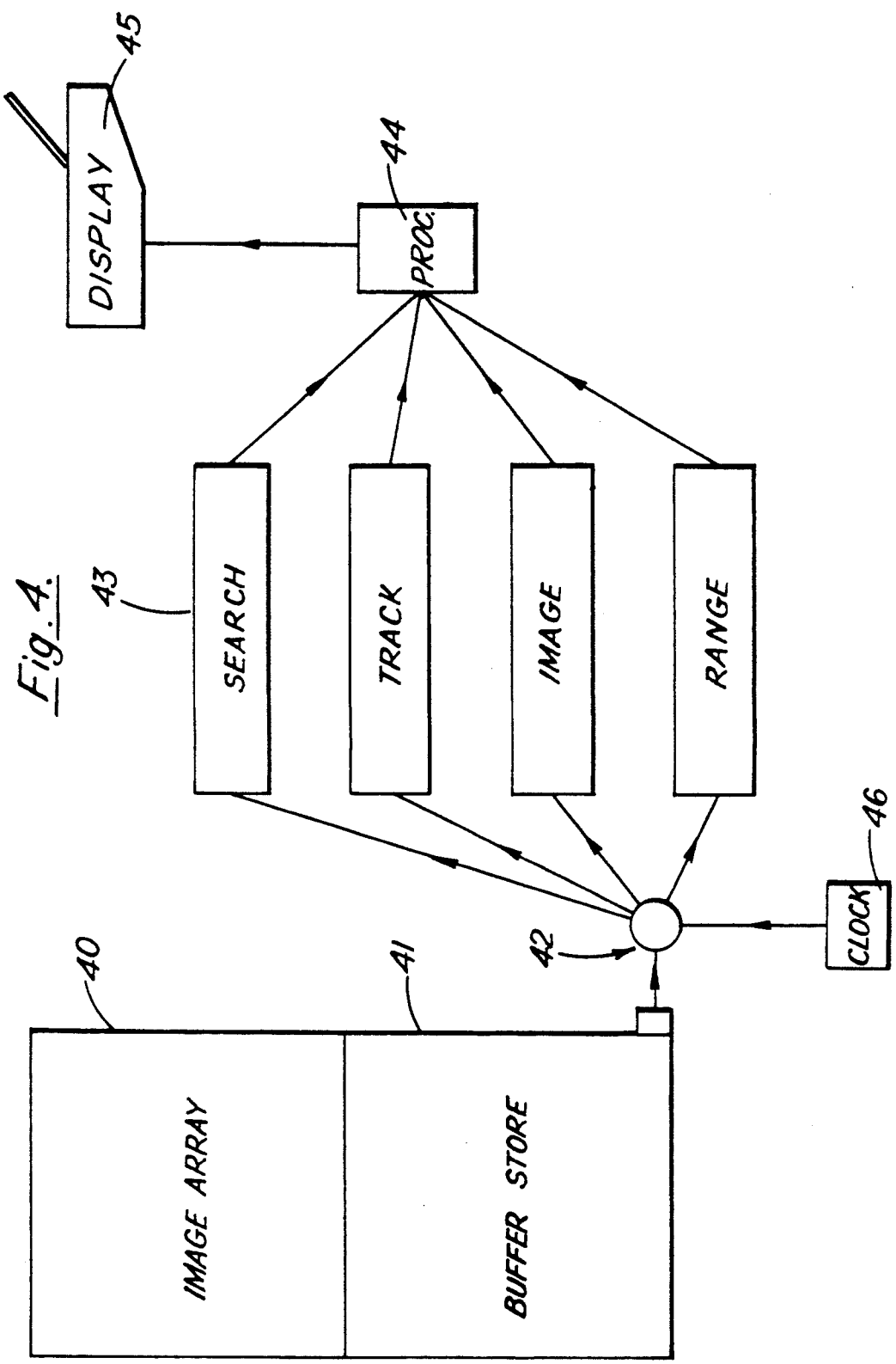
FIG. 4 is a schematic data processing arrangement for a solid state imager.

FIG. 4 shows a schematic processing arrangement. Present charge-coupled devices operates at rates of 17 MH$_z$ which are well in excess of those needed for the multi-mode operation here required. The image detector array 40 is associated with a buffer store matrix 41 from which the output gate 42 distributes the video signal to search, track, image or range channels of the processor 43 under clock control. The processor 43 reads out the stored signals at a display processor 44 and display unit 45 independently of the operating mode. The only modification required is that necessary for dual waveband operation where the electrical voltages applied to the detector array are commutated, as described above. For the multi-mode operations, the processor will, preferably, operates on a selectable pre-programmed basis, the basic operations consisting of the usual computer functions such as output sealing, shifting, delaying and adding, achieved with the use of logic gates and inverters operated under the control of the clock pulse generator 46.

Figure 5:
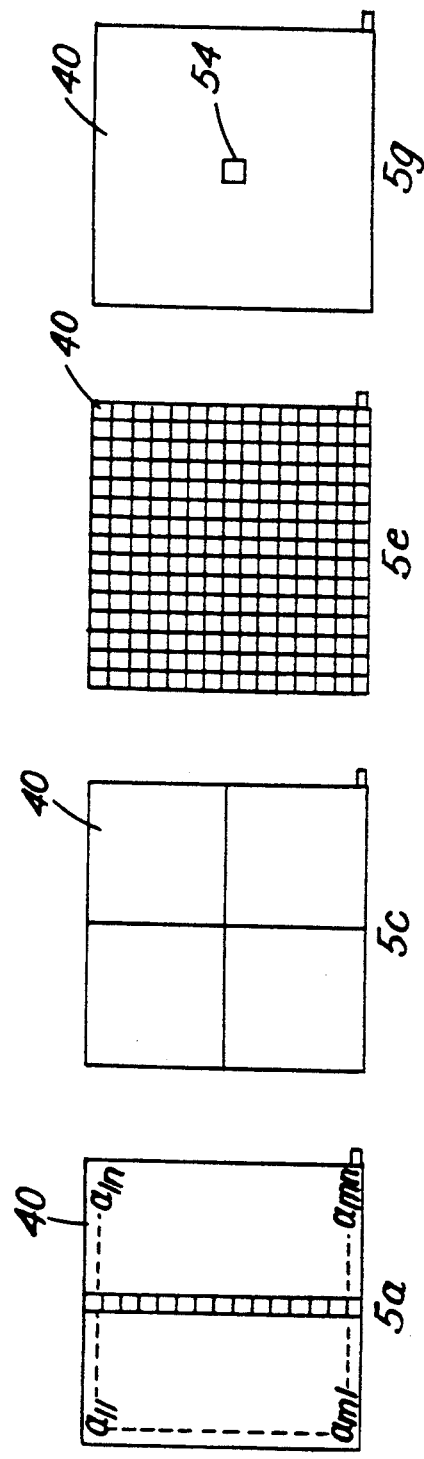
FIG. 5 is a diagrammatic arrangement of a matrix detector in a multi-mode role.
Figure 5:
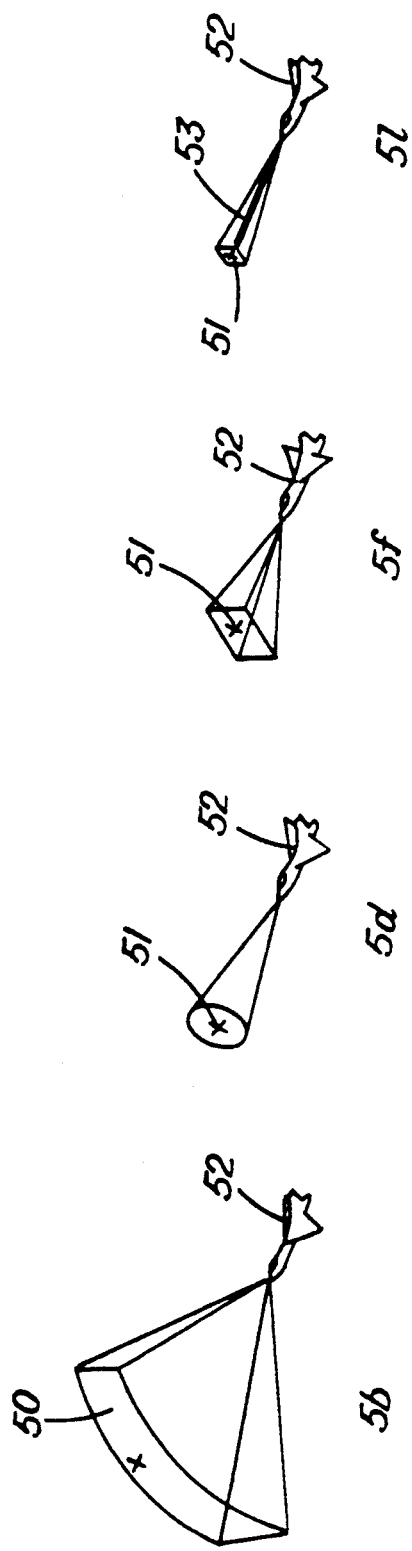

FIGS. 5a–5b give an indication of the function of the matrix detector in a multi-mode role, and which may be better understood by reference to out aforementioned co-pending patent application describing the use of such a detector array in conjunction with scanning optical heads.

FIGS. 5a and 5b show that a line array of the matrix 40 may be used for searching sections 50 of the sky or ground in either single or multi-mode scans. Having detected a target 51 continuous tracking can be maintained by some form of quadrant detector configuration as indicated in FIGS. 5c and 5d. Target tracking continues until the sensor-carrying aircraft 52 is within close enough range for imaging techniques to be applicable as indicated in FIGS. 5e and 5f. Using long focal length optics it is possible to image on to the target at long range provided that the sensor optical axis is aligned with the target sight line.

When the target range has closed sufficiently for visual contact the by human eye a laser beam 53 can be used for precisely measuring target range. In existing units a separate single detector is employed for this last purpose. However, with the present matrix detector it is possible to use the signals received in the central elements 54 of the array 40 as the laser ranging channel as indicated in FIGS. 5g and 5h. Since the pulse repetition frequency of a laser is generally limited to something like 10 pps this ranging process can be multiplexed with the imaging and tracking modes, if desired.

What we claim is:

1. A charge-coupled detector array, comprising a semi-conductor substrate having first and second oppositelyfacing surfaces on opposite sides thereof, an insulating layer on said first surface, a first series of electrodes applied to said insulating layer and connected to a first common lead, a second series of electrodes applied to said insulating layer and connected to a second lead, said insulating surface layer being castellated so as to give portions thereof at a first level and portions thereof at a second different level and each electrode applied so as to extend across two adjacent portions of said castellated surface respectively at said first and second levels and also down an intervening castillation flank, and a passivating material applied to only those areas of said second surface of said substrate surface that are opposite portions of the electrodes of said first series that are at said first level, said passivating material forming a heterojunction to change the response waveband of those areas to which it is applied.

2. A detector array according to claim 1, wherein said first and second levels of said castellated surface are lower and upper levels respectively.

3. A detector array according to claim 1, wherein all said electrodes are in a single row, with alternate electrodes forming said first series of electrodes and the remaining intervening electrodes forming said second series, and a metallic masking applied to areas of said second surface that are opposite those portions of all electrodes of both series that are at said second level.

4. A detector array according to claim 1, wherein the passivating material is indium antimonide.

5. A detector matrix comprising a plurality of arrays according to claim 1, disposed side-by-side in parallel rows.

* * * * *